United States Patent
Mheen et al.

(10) Patent No.: US 7,928,442 B2
(45) Date of Patent: Apr. 19, 2011

(54) OPTICAL DEVICE HAVING STRAINED BURIED CHANNEL

(75) Inventors: Bongki Mheen, Daejeon (KR);
 Jeong-Woo Park, Daejeon (KR);
 Hyun-Soo Kim, Daejeon (KR);
 Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 6 days.

(21) Appl. No.: 12/441,381

(22) PCT Filed: Aug. 17, 2007

(86) PCT No.: PCT/KR2007/003936
 § 371 (c)(1),
 (2), (4) Date: Mar. 13, 2009

(87) PCT Pub. No.: WO2008/048002
 PCT Pub. Date: Apr. 24, 2008

(65) Prior Publication Data
 US 2009/0261383 A1   Oct. 22, 2009

(30) Foreign Application Priority Data
 Oct. 19, 2006  (KR) .................. 10-2006-0102036

(51) Int. Cl.
 *H01L 31/036* (2006.01)
(52) U.S. Cl. .............. 257/65; 257/16; 257/27; 257/450; 257/E31.109; 438/48; 438/570
(58) Field of Classification Search .............. 257/65, 257/E31.109
 See application file for complete search history.

(56) References Cited

U.S. PATENT DOCUMENTS

| | | | |
|---|---|---|---|
| 6,801,676 B1 | 10/2004 | Liu | |
| 2004/0178406 A1* | 9/2004 | Chu | ................ 257/19 |
| 2005/0093021 A1 | 5/2005 | Ouyang et al. | |
| 2005/0139930 A1 | 6/2005 | Chidambarrao et al. | |
| 2005/0279992 A1 | 12/2005 | Gupta et al. | |
| 2005/0285139 A1 | 12/2005 | Forbes | |

FOREIGN PATENT DOCUMENTS

JP    09-260710    10/1997

OTHER PUBLICATIONS

Ansheng Liu et al., "A high-speed silicon optical modulator based on a metal-oxide semiconductor capacitor," pp. 615-618, Nature, vol. 427, Feb. 12, 2004.
Qianfan Xu et al., "Micrometre-scale silicon electro-optic modulator," pp. 325-327, Nature, vol. 435, May 19, 2005.
International Search Report for application PCT/KR2007/003936 filed Aug. 17, 2007.
Written Opinion of the International Searching Authority for application PCT/KR2007/003936 filed Aug. 17, 2007

* cited by examiner

*Primary Examiner* — Ajay K Arora

(57) ABSTRACT

Provided is an optical device having a strained buried channel area. The optical device includes: a semiconductor substrate of a first conductive type; a gate insulating layer formed on the semiconductor substrate; a gate of a second conductive type opposite to the first conductive type, formed on the gate insulating layer; a high density dopant diffusion area formed in the semiconductor substrate under the gate and doped with a first conductive type dopant having a higher density than the semiconductor substrate; a strained buried channel area formed of a semiconductor material having a different lattice parameter from a material of which the semiconductor substrate is formed and extending between the gate insulating layer and the semiconductor substrate to contact the high density dopant diffusion area; and a semiconductor cap layer formed between the gate insulating layer and the strained buried channel area.

18 Claims, 8 Drawing Sheets

OPTICAL DEVICE HAVING STRAINED BURIED CHANNEL

TECHNICAL FIELD

The present invention relates to a silicon photonics, and more particularly, to an optical device of a metal-insulator-semiconductor (MIS) structure.

BACKGROUND ART

Conventional data transmission using metal lines has limited transmission speed due to delay of a resistor-capacitor of a transmission line. In particular, the communication speed between a central processing unit (CPU) and a graphics processing unit (GPU) required for games has gradually increased. Thus, the demand for higher communication speeds has also increased. Silicon photonics has been suggested to satisfy this demand and can provide high integration. In particular, a monolithic device for optical communications can be manufactured to reliably transmit high-speed data generated inside a chip to an external chip. Also, an optical device using silicon photonics does not need to be additionally packaged, as opposed to using another device outside a chip. Thus, packaging cost can be reduced, and the operation speed is not limited by the packaging. As a result, high-quality data can be transmitted to an external chip.

However, elements such as a light source, an optical modulator, an optical light receiving device, a low noise amplifier, a limiting amplifier, an optical coupler, a multiplexer, a demultiplexer, an optical filter, etc. must be improved to use silicon photonics. The optical modulator is the core element.

An optical modulator has a maximum extinction ratio and a rapid switching structure. Also, the process of manufacturing the optical modulator is simple and may be compatible with a silicon process. For example, in a Mach-Zehnder structure obtaining an extinction ratio using an optical phase difference, an optical phase must be changed using a more efficient method to obtain a maximum extinction ratio.

An optical modulator having a metal-oxide-silicon (MOS) capacitor structure has been suggested for conventional silicon photonics.

FIG. 1 is a cross-sectional view showing the important parts of an optical modulator having a MOS capacitor type structure according to the prior art. Referring to FIG. 1, an optical modulator 10 having a MOS capacitor structure includes a silicon on insulator (SOI) substrate including a silicon substrate 12, a buried oxide layer (BOX) 14, and an n-type silicon substrate 16. A pair of $n^+$-type doping areas 22 used as electron sources are formed on both sides of a p-type polysilicon layer 20, which is an optical beam path formed on the n-type silicon substrate 16. The $n^+$-type doping areas 22 are grounded away from an optical condensing area 24 around the optical beam path.

Electrons and holes accumulate above and below a gate insulating layer 22 formed between the n-type silicon substrate 16 and the p-type polysilicon layer 20.

Metal contacts 32 are formed on dopant areas 34 connected to the p-type polysilicon layer 20 to apply a positive driving voltage $V_D$ to the dopant areas 34. An insulating layer 36 is formed between the metal contacts 32 and the optical condensing area 24.

In the optical modulator shown in FIG. 1, the optical condensing area 24 is formed mainly under the gate insulating layer 22, and a phase is delayed by the electrons accumulated under the gate insulating layer 22.

FIG. 2 shows an optical mode distribution of light condensed in the optical condensing area 24. Referring to FIG. 2, reference character A denotes a normalized optical profile obtained when the gate insulating layer 22 is relatively thin, and reference character B denotes a normalized optical profile obtained when the gate insulating layer 22 is thicker than in the normalized optical profile A.

As shown in FIG. 2, the maximum peak of the condensed light is positioned under the gate insulating layer 22.

DISCLOSURE OF INVENTION

Technical Problem

However, the $n^+$-type doping areas 22 must be as far away as possible from the optical condensing area 24 to prevent optical attenuation in the optical condensing area 24. If a distance between the $n^+$-type doping areas 22 and the optical condensing area 24 is too great, an optical modulation speed becomes slow. Thus, the switching speed of an optical device is reduced.

Technical Solution

The present invention provides an optical device capable of preventing optical attenuation in an optical condensing area and increasing optical modulation efficiency to secure a desired switching speed and an improved operation speed.

According to an aspect of the present invention, there is provided an optical device including: a semiconductor substrate of a first conductive type; a gate insulating layer formed on the semiconductor substrate; a gate of a second conductive type opposite to the first conductive type, formed on the gate insulating layer; a high density dopant diffusion area formed in the semiconductor substrate under the gate and doped with a first conductive type dopant having a higher density than the semiconductor substrate; a strained buried channel area formed of a semiconductor material having a different lattice parameter from a material of which the semiconductor substrate is formed and extending between the gate insulating layer and the semiconductor substrate to contact the high density dopant diffusion area; and a semiconductor cap layer formed between the gate insulating layer and the strained buried channel area.

If the first conductive type is a p-type, the strained buried channel area may be formed of a material having compressive stress. For example, the strained buried channel area may be formed of a SiGe layer. The strained buried channel area may have a retrograded doping profile.

If the first conductive type is an n-type, the strained buried channel area may be formed of a material having tensile stress. For example, the strained buried channel area may be formed of a SiC layer. Alternatively, the strained buried channel area may be formed of a strained Si layer having tensile stress. In this case, the optical device may further include a SiGe buffer layer formed in the semiconductor substrate under the strained buried channel area in the semiconductor substrate.

The high density dopant diffusion area may include first and second high density dopant diffusion areas contacting the strained buried channel area. In this case, the first and second high density dopant diffusion areas may be spaced apart from each other in the semiconductor substrate with the gate disposed therebetween. At least one of the first and second high density dopant diffusion areas may be grounded.

The high density dopant diffusion area may include a first high density dopant diffusion area which contacts the strained buried channel area and a second high density dopant diffusion area which does not contact the strained buried channel area and is formed in the semiconductor substrate. In this case, the first and second high density dopant diffusion areas may be spaced apart from each other in the semi-conductor substrate with the gate disposed therebetween. At least one of the first and second high density dopant diffusion areas may be grounded.

The optical device may further include a current blocking insulating layer formed on the semiconductor cap layer to cover sidewalls of the gate and sidewalls of the gate insulating layer.

The semiconductor cap layer may include a protrusion extending from an upper surface of the strained buried channel area to the gate insulating layer. A sidewall of the protrusion of the semiconductor cap layer may be covered with the current blocking insulating layer. The semiconductor cap layer may be a silicon epitaxial layer.

The optical device may further include: a conductive layer formed on an insulating layer and connected to the gate so as to apply a driving voltage to the gate; and a metal line connected to the conductive layer through a via contact. The via contact may be horizontally spaced apart from the gate. The conductive layer may be formed of doped polysilicon.

The optical device may include a Mach-Zehnder interferometer optical modulator adopting the optical device as an optical phase shifter.

The optical device may include a Michelson interferometer optical modulator adopting the optical device as an optical phase shifter.

The optical device may include a ring-resonator interferometer optical modulator adopting the optical device as an optical phase shifter.

The optical device may include a multi-channel light intensity equalizer adopting the optical device as an optical attenuator.

The optical device may include an optical switch adopting the optical device as an optical phase shifter.

The optical device may include a variable optical filter adopting the optical device as the optical phase shifter.

Advantageous Effects

According to the present invention, in an optical device having a strained buried channel according to the present invention, a strained buried channel area can be formed of a semiconductor material between a pair of high density dopant diffusion areas in a semiconductor substrate. The semiconductor material can have a different lattice parameter from the material of the semiconductor substrate.

The strained buried channel area can be formed in a position in which optical condensing is maximum, to manufacture a silicon-based MIS optical device. Thus, the same optical phase can be changed with a low capacitance and a low resistance. In particular, an optical modulator having a silicon-based CMOS capacitor type structure can adopt a strained buried channel area using a carrier modulation effect. Thus, resistance can be lowered. Also, charge can be accumulated due to the low capacitance. In addition, charge mobility can be improved using a strained channel structure, and an optical mode confinement factor of a charged layer can be increased in the strained buried channel area, to reduce a modulation distance. Thus, the operation speed of the optical device can be increased. Moreover, the strained channel structure can be compatible with a relatively simple MIS structure. Thus, the optical device can be manufactured to have a large area. As a result, manufacturing cost can be lowered and optical attenuation can be reduced, to obtain improved optical phase shift characteristics. Furthermore, an oxide layer having high interface characteristics can be used. Thus, a trap density can be lowered to minimize deterioration of performance during high-speed operation.

DESCRIPTION OF DRAWINGS

The above and other features and advantages of the present invention will become more apparent by describing in detail exemplary embodiments thereof with reference to the attached drawings in which.

BEST MODE

Figure 3:
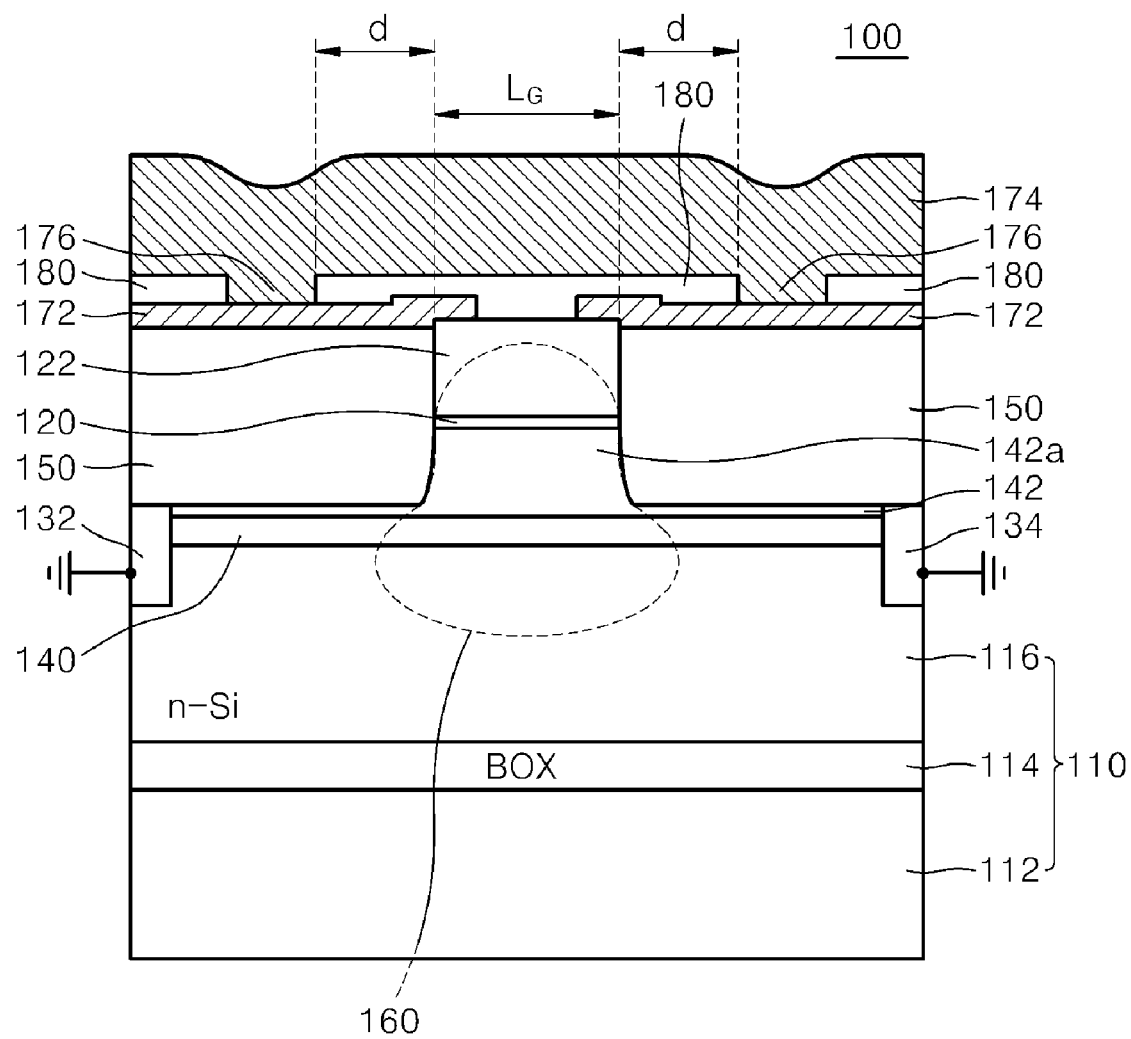
FIG. 3 is a cross-sectional view showing the essential parts of an optical device according to an embodiment of the present invention.

FIG. 3 is a cross-sectional view showing the essential parts of an optical device according to an embodiment of the present invention.

Figure 1:
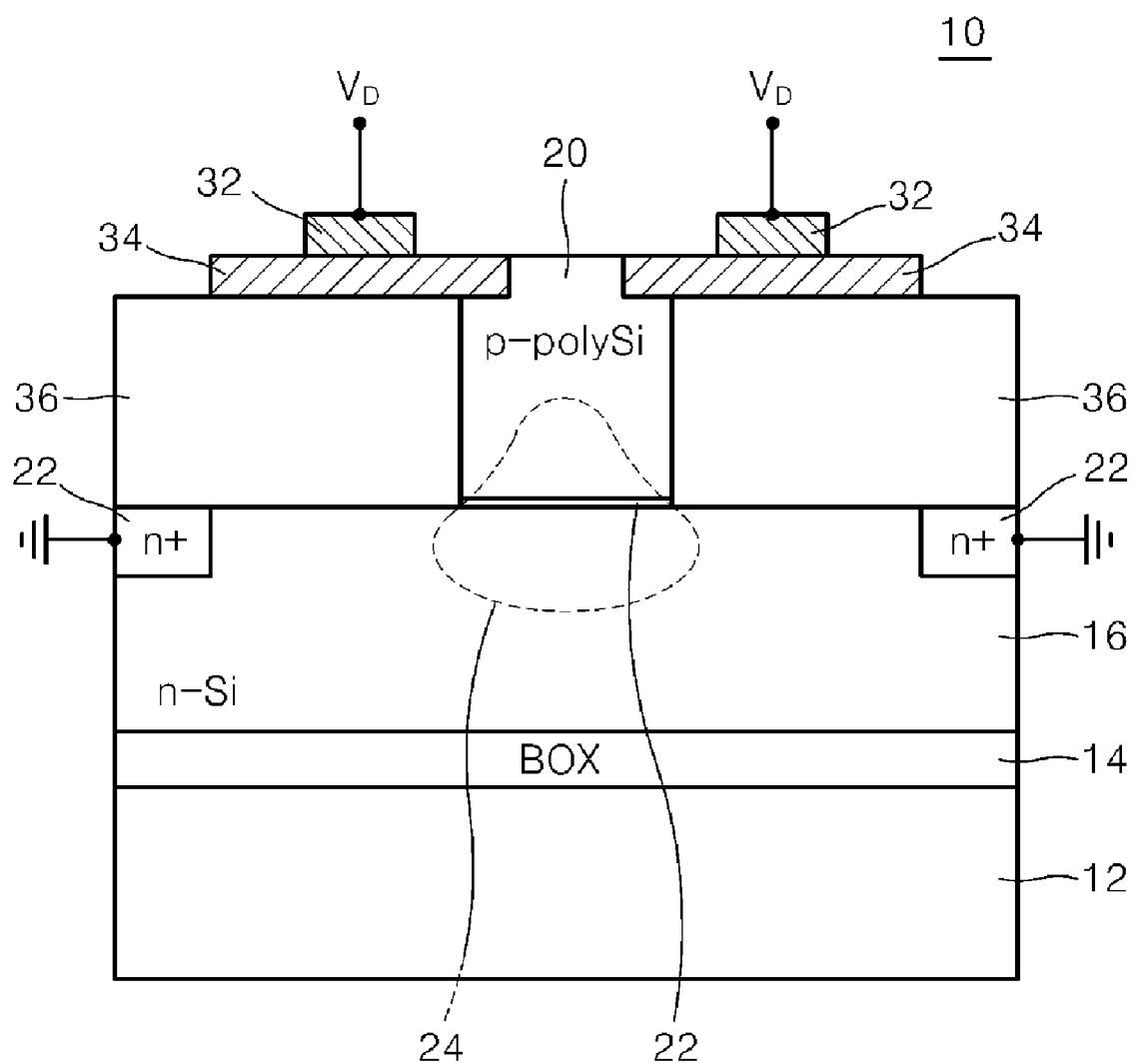
FIG. 1 is a cross-sectional view showing the essential parts of an optical modulator having a metal-oxide-silicon (MOS) capacitor type structure according to the prior art.
Figure 2:
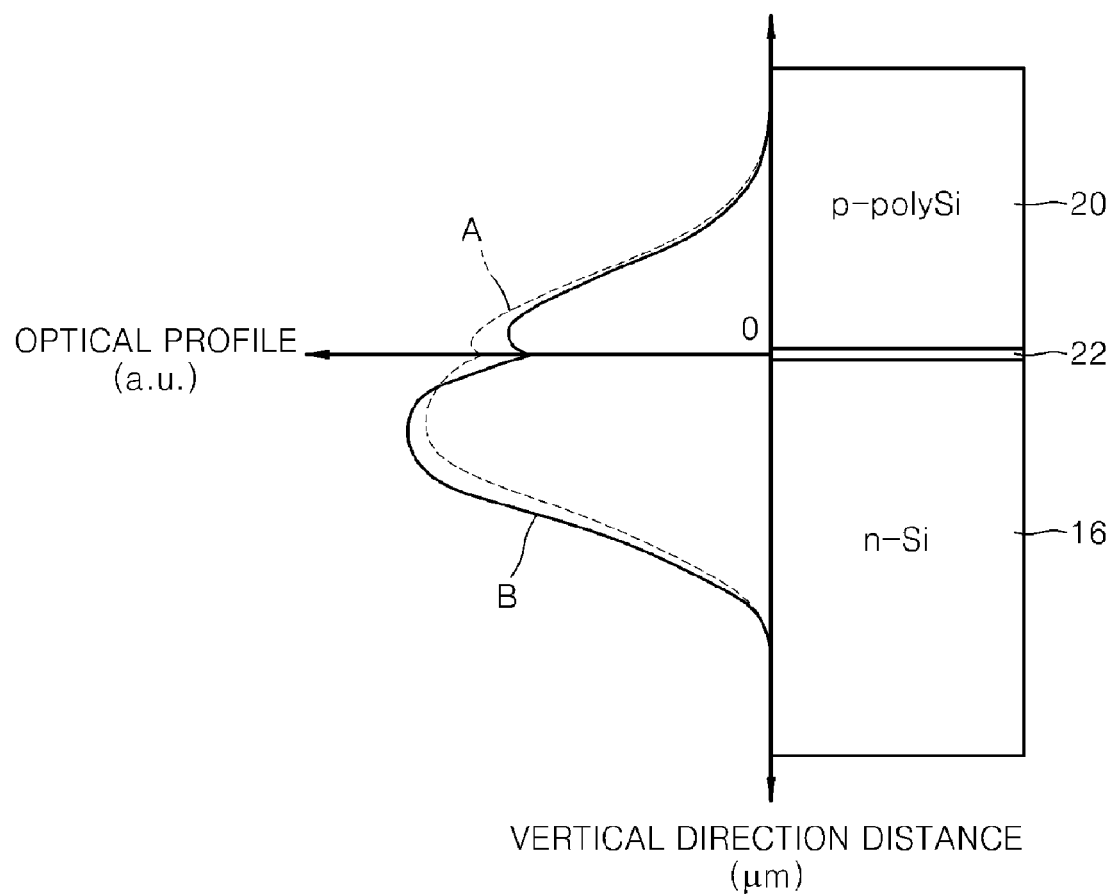
FIG. 2 shows an optical mode distribution of light condensed in an optical condensing area of an optical modulator having a MOS capacitor type structure according to the prior art.

In the present embodiment, the optical device 100 is constructed on a silicon-oxide-insulator (SOI) substrate 110, in which a first silicon substrate 112, a buried oxide layer (BOX) 114, and a second silicon substrate 116 are sequentially stacked. However, the present invention is not limited to this. For instance, the optical device 100 according to the present embodiment may use a bulk silicon substrate instead of the second silicon substrate 116 shown in FIG. 1. In this case, the optical device 100 may use a structure in which a material layer having a lower refractive index than a silicon substrate covers the backside of the silicon substrate.

The second silicon substrate 116 may be doped with p-type or n-type dopant.

The optical device 100 according to the present embodiment includes a gate insulating layer 120 formed on the second silicon substrate 116 and a gate 122 formed on the gate insulating layer 120. The gate insulating layer 120 may be a silicon oxide layer. The gate 122 may be formed of a semiconductor layer doped with the opposite conductive type dopant to a conductive type of the second silicon substrate 116. For example, if the second silicon substrate 116 is formed of a p-type silicon layer, the gate 122 may be formed of n-type polysilicon.

A pair of high density dopant diffusion areas 132 and 134 are formed in the second substrate 116 on both sides of the gate 122. The high density dopant diffusion areas 132 and 134 are doped with a dopant of the same conductive type as the second silicon substrate 116 but to a higher doping density. The high density dopant diffusion areas 132 and 134 operate as ohmic layers for an ohmic contact, and may be separately grounded. It has been described with reference to FIG. 3 that the pair of high density dopant diffusion areas 132 and 134 are formed on both sides of the gate 122. Alternatively, only one of the pair of high density dopant diffusion areas 132 and 134 may be formed.

A strained buried channel area 140 extends between the gate insulating layer 120 and the second silicon substrate 116 under the gate 122. Also, a semiconductor cap layer 142 is formed between the gate insulating layer 120 and the strained buried channel area 140. The semiconductor cap layer 142 may be a silicon epitaxial layer.

A current blocking insulating layer 150 is formed on both sides of the gate 122 on the semiconductor cap layer 142. Sidewalls of the gate insulating layer and sidewalls of the gate 122 are covered by the current blocking insulating layer 150. Thus, the length $L_G$ of the gate 122 is restricted by the current blocking insulating layer 150. For example, the current blocking insulating layer 150 may be a silicon oxide layer.

A conductive layer 172 is formed on the current blocking insulating layer 150. The conductive layer 172 is connected between a metal line layer 174 and the gate 122 to apply a driving voltage to the gate 122. The conductive layer 172 may be formed of doped polysilicon. Also, the metal line layer 174 may be formed of aluminum (Al). A via contact 176 may be formed at a distance d from the gate 122 in a horizontal direction to electrically connect the conductive layer 172 to the metal line layer 174. Thus, a resistor-capacitor (RC) time constant of the optical device can be reduced. Also, the conductive layer 172 can be formed of polysilicon doped to a high density to improve electrical coupling of the via contact 176 with the gate 122 and further reduce the RC time constant of the optical device 100.

Referring to FIG. 3, reference numeral 180 denotes a current blocking insulating layer. For example, the current blocking insulating layer 180 may be a silicon oxide layer.

The semiconductor cap layer 142 includes a protrusion 142a of the upper surface of the strained buried channel area 140 which extends to the gate insulating layer 120. A sidewall of the protrusion 142a of the semiconductor cap layer 142 is covered by the current blocking insulating layer 150.

The gate 122 may be formed in a higher position due to the protrusion 142a of the semiconductor cap layer 142, and thus a buried channel may be positioned more deeply. Thus, optical attenuation in an optical condensing area 160 caused by the gate 122 can be reduced. However, the present invention is not limited to the structure of FIG. 3 in which the protrusion 142a is formed in the semiconductor cap layer 142. The semiconductor cap layer 142 may be formed on the upper surface of the strained buried channel area 140 but may not include the protrusion 142a. It must be understood that this structure is included in the scope of the present invention.

The strained buried channel area 140 may be formed of a semiconductor material having a different lattice parameter from the material of the second silicon substrate 116. For example, if the second silicon substrate 116 and the high density dopant diffusion areas 132 and 134 are of a p-type, i.e. a phase is to be changed using holes, the strained buried channel area 140 may be formed a SiGe layer having a larger lattice parameter than the second silicon substrate 116 and the semiconductor cap layer 142. The SiGe layer epitaxially grown on the second silicon layer 116 has the same lattice network as a silicon layer and has a compressive stress due to a lattice parameter difference in the second silicon layer 116 when the SiGe layer is epitaxially grown on the second silicon layer 116. The content of Ge may be adjusted in the strained buried channel area 140 formed of the SiGe layer, to adjust the compressive stress in the strained buried channel area 140 to the desired level. Thus, the content of Ge in the strained buried channel area 140 formed of the SiGe layer may vary. Also, the strained buried channel area 140 formed of the SiGe layer may have a retrograde doping profile.

Mode for Invention

Figure 4:
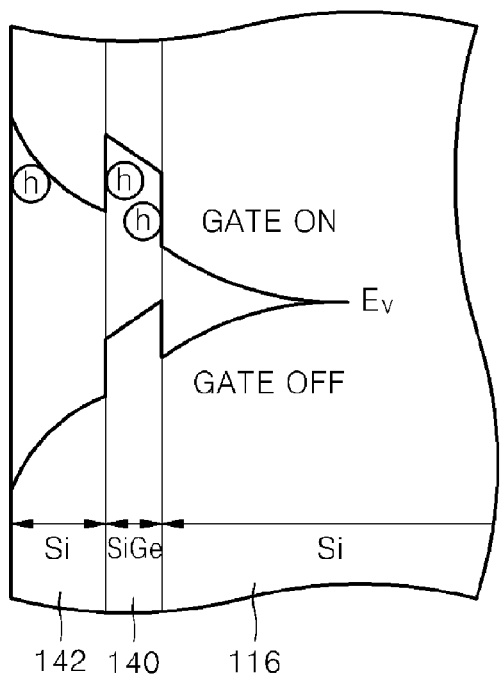
FIG. 4 shows the energy distribution around a SiGe strained buried channel area of the optical device of the FIG. 3.

FIG. 4 shows the energy distribution around the strained buried channel area 140 of the optical device 100 of the FIG. 3 formed of the SiGe layer.

As shown in FIG. 4, if a negative voltage is applied to the gate 122, a hole channel is formed in the semiconductor cap layer 142. However, the hole channel is also formed around the strained buried channel area 140 due to an offset of a balance band. Thus, a trap density can be lowered, and a sufficient hole density can vary under a rapid switching condition.

As described above, if a phase is to be changed using holes, an optical phase modulation ratio of holes is generally approximately double that of electrons. Thus, if the second silicon layer 116 is of p-type and the high density dopant diffusion areas 132 and 134 are of $p^+$ to change the phase using the holes, the strained buried channel area 140 may be formed of the SiGe layer to improve the mobility of the holes. Thus, the resistance of the second silicon substrate 116 may be reduced, and the operation speed of the optical device 100 may be improved.

As another example, if the second silicon substrate 116 and the high density dopant diffusion areas 132 and 134 are of n-type, i.e. the phase is to be changed using electrons, the strained buried channel area 140 may be formed of a SiC layer. The strained buried channel area 140 formed of the SiC layer has a tensile stress. The content of C may be adjusted in the strained buried channel area 140 formed of the SiC layer to adjust the tensile stress in the strained buried channel area 140 to the desired level. Thus, the content of C in the strained buried channel area 140 formed of the SiC layer may vary.

As another example, although not shown, the strained buried channel area 140 may be formed of a Si layer having a tensile stress. In this case, an additional SiGe buffer layer (not shown) may be formed under the strained buried channel area 140 to apply the tensile stress to the strained buried channel area 140.

As shown in FIG. 3, the strained buried channel area 140 extends between the pair of high density dopant diffusion areas 132 and 134 so that both sides of the strained buried channel area 140 contact the pair of high density dopant diffusion areas 132 and 134. However, the present invention is not limited to this. In the present invention, the strained buried channel area 140 may contact only one of the pair of high density dopant diffusion areas 132 and 134. Here, the one of the high density dopant diffusion areas 132 and 134 which does not contact the strained buried channel area 140 may constitute a contact for stabilizing the potential of the second silicon substrate 116.

The strained buried channel area 140 may be formed in a position corresponding to a peak light position in the optical condensing area 160. For this purpose, various optimal methods may be adopted. For example, a channel of the strained buried channel area 140 may be formed of a multiple quantum well, and the thicknesses of the gate insulating layer 120 and the semiconductor cap layer 142 may be adjusted to form the strained buried channel area 140 in the desired position. As another example, although not shown, the strained buried channel area 140 may be positioned between the gate 122 and the current blocking insulating layer 150.

As described above, the strained buried channel area 140 including a buried channel may be formed of a material having a different lattice parameter from the second silicon layer 116 to improve the mobility of electrons in the buried channel. Thus, although the high density dopant diffusion areas 132 and 134 are located far from the optical condensing area 160, a modulation length may be substantially reduced. The high density dopant diffusion areas 132 and 134 may be located at a distance from the optical condensing area 160 without increasing the modulation length. Thus, optical attenuation in the optical condensing area 160 may be reduced.

In particular, if the strained buried channel area 140 is formed of the SiGe layer, the SiGe layer has a higher refractive index than a pure Si layer and thus is more beneficial to light confinement to a channel area. Thus, the modulation length may be further reduced, which lowers an equivalent capacitance and further improves the operation speed.

Also, the buried channel may be formed by the strained buried channel area 140 to reduce a metal-oxide-semiconductor (MOS) capacitance of the buried channel. The two characteristics described above contribute to increasing the operation speed and optical delay ratio of the optical device 100.

Figure 5:
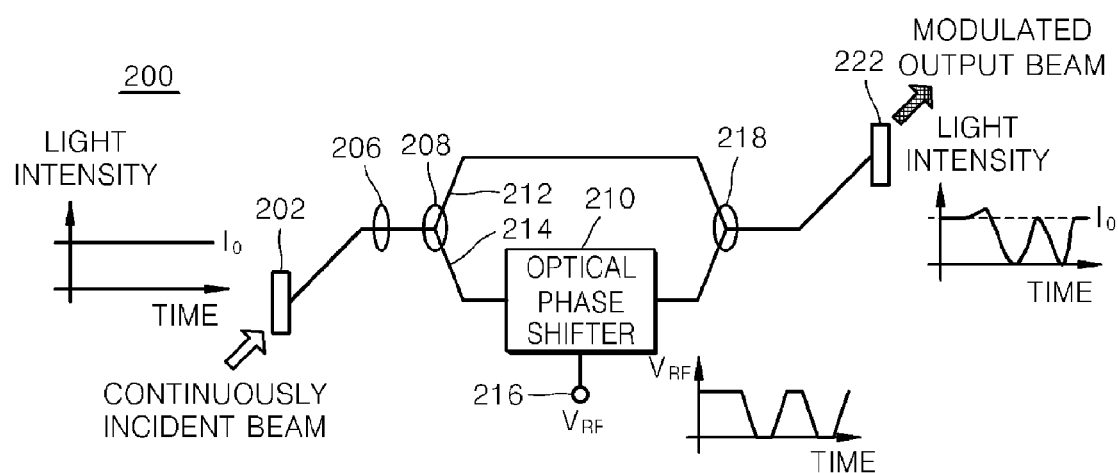
FIG. 5 shows the important parts of an optical device according to another embodiment of the present invention.

FIG. 5 shows the important parts of an optical device 200 according to another embodiment of the present invention.

The optical device 200 illustrated in FIG. 5 includes a Mach-Zehnder interferometer optical modulator adopting the optical device 100 of FIG. 3 as an optical phase shifter 210.

The Mach-Zehnder interferometer optical modulator includes a passive waveguide 206, a Y-light intensity demultiplexer 208, the optical phase shifter 210, and a Y-light intensity multiplexer 218. The optical phase shifter 210 may be the optical device 100 having the structure illustrated in FIG. 3.

A continuously incident beam having a continuous light intensity is input to the passive waveguide 206 through a nonreflective layer 202. The Y-light intensity de-multiplexer 208 demultiplexes the continuously incident beam to two arms 212 and 214 of the Mach-Zehnder interferometer optical modulator. In FIG. 5, the optical phase shifter 210 is provided at the arm 214. However, in the optical device 200 according to the present embodiment, the optical phase shifter 200 may be provided at least one of the arms 212 and 214. A phase is modulated by applying a modulated voltage $V_{RF}$ through a modulation signal applying port 216 of the optical phase shifter 210. The beam modulated by the optical phase shifter 210 is offset or reinforcement interfered by the Y-light intensity multiplexer 218 to output an optical signal having a modulated intensity through a nonreflective layer 222.

A reflection occurs from an as-cleaved facet of the passive waveguide 206 due to a refractive index difference at the air interface. Thus, the nonreflective layers 202 and 222 may be disposed at the as-cleaved facet of input and output parts of the passive waveguide 206. The unreflective layers 202 and 222 may be disposed to incline to the as-cleaved facet of the passive waveguide 206 to further reduce the reflection from the as-cleaved facet of the passive waveguide 206.

Figure 6:
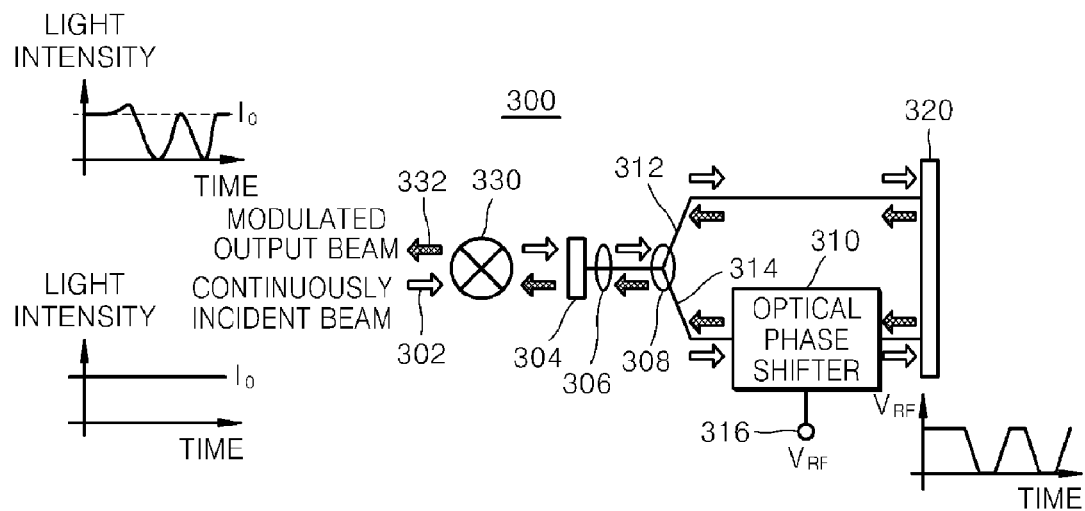
FIG. 6 shows the important parts of an optical device according to another embodiment of the present invention.

FIG. 6 shows the important parts of an optical device 300 according to another embodiment of the present invention.

The optical device 300 illustrated in FIG. 6 includes a Michelson type optical modulator adopting the optical device of FIG. 3 as an optical phase shifter 310.

The Michelson type optical modulator includes a passive waveguide 306, a Y-light intensity demultiplexer 308, and the optical phase shifter 310.

The optical phase shifter 310 may be the optical device 100 having the structure illustrated in FIG. 3. A continuously incident beam 302 having a continuous light intensity is input to the passive waveguide 306, and the Y-light intensity demultiplexer 308 demultiplexes the continuously incident beam into two arms 312 and 314 of a Michelson interferometer. The optical phase shifter 310 having the structure of the optical device 100 of FIG. 3 is provided at least one of the two arms 312 and 314. In FIG. 6, the optical phase shifter 310 is provided at the arm 314. A phase is modulated by applying a modulated voltage $V_{RF}$ through a modulation signal applying port 316 of the optical phase shifter 310. The beam modulated by the optical phase shifter 310 is reflected from an as-cleaved facet or a facet on which a high reflecting layer 320 is deposited. Thus, a phase is modulated once more. Thereafter, the Y-light intensity de-multiplexer 308 offsets or reinforcement interferes the continuously incident beam 302 to output an output beam 332 having a modulated light intensity. A reflection occurs from an as-cleaved facet of the passive waveguide 306 due to a refractive index difference at the air interface. Thus, a nonreflective layer 304 may be deposited on an input part of the passive waveguide 306. The nonreflective layer 304 may be disposed toward input and output parts of the passive waveguide 306 to incline to the as-cleaved facet of the passive waveguide 306 so as to further reduce the reflection from the as-cleaved facet. Also, a circulator 330 may be additionally provided to separate the continuously incident beam 302 and the modulated output beam 332 from each other.

The Y-light intensity demultiplexer 208, the Y-light intensity multiplexer 218, and the Y-light intensity demultiplexer 308 shown in FIGS. 5 and 6 may be replaced with a direction coupler or a multimode interferometer (MMI) coupler.

Figure 7:
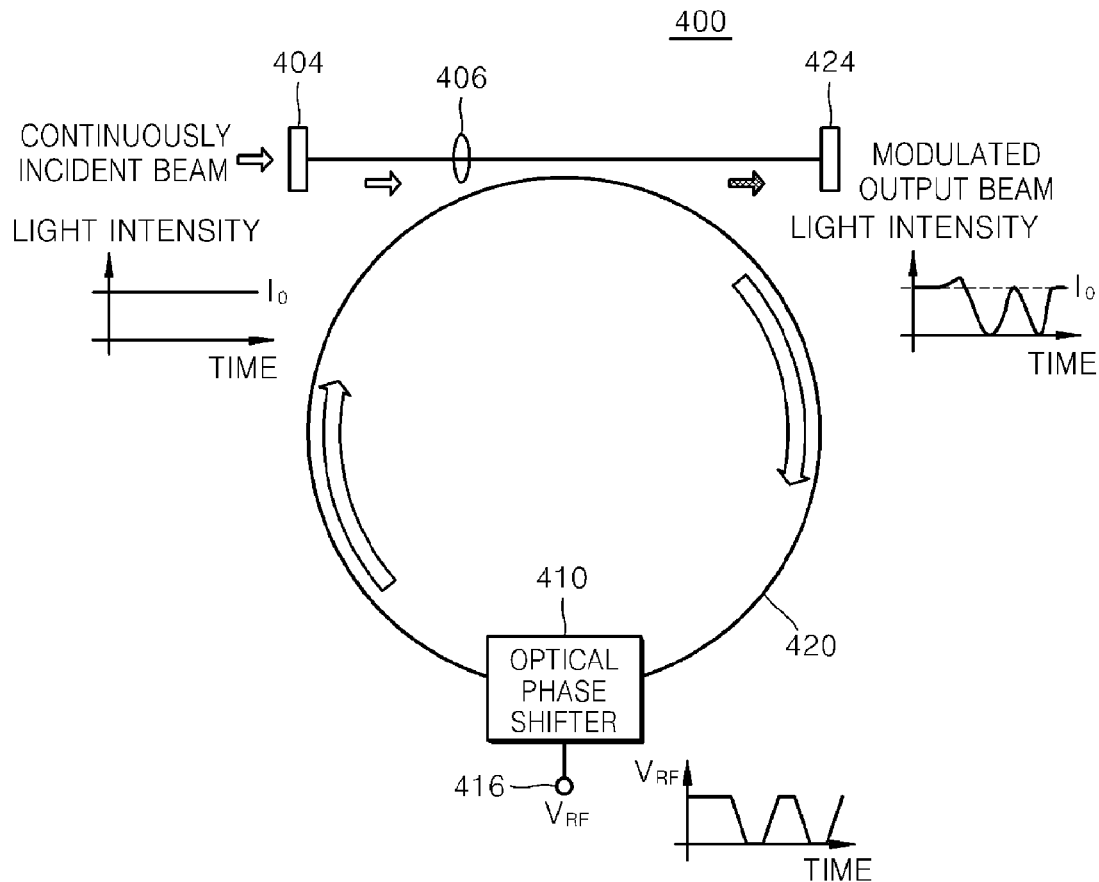
FIG. 7 shows the important parts of an optical device according to another embodiment of the present invention.

FIG. 7 shows the important parts of an optical device 400 according to another embodiment of the present invention.

The optical device 400 illustrated in FIG. 7 includes a ring-resonator type optical modulator adopting the optical device 100 of FIG. 3 as an optical phase shifter 410.

The ring-resonator type optical modulator includes a passive waveguide 406 and the optical phase shifter 410 provided at a ring resonator 420. The optical phase shifter 410 may be the optical device 100 having the structure illustrated in FIG. 3. A continuously incident beam is input to the passive waveguide 406 and then coupled by the ring resonator 420. Thus, if a modulated voltage $V_{RF}$ is applied through a modulation signal applying port 416 of the optical phase shifter 410 of the ring resonator 420, an effective refractive index varies. Thus, an input wavelength $\lambda_0$ is no longer coupled to the ring resonator 420 but is output to the passive waveguide 406. According to this principle, an optical signal is modulated depending on an applied voltage. A reflection occurs from an as-cleaved facet of the passive waveguide 406 due to a refractive index difference at the air interface. Thus, a nonreflective layer 404 may be deposited on an input part of the passive waveguide 406. Also, nonreflective layers 404 and 424 may be disposed toward input and output parts of the passive waveguide 406 to incline to the as-cleaved facet of the passive waveguide 406 so as to further reduce the reflection from the as-cleaved facet of the passive waveguide 406. The optical device 400 illustrated in FIG. 7, may be used as a variable optical filter.

Figure 8:
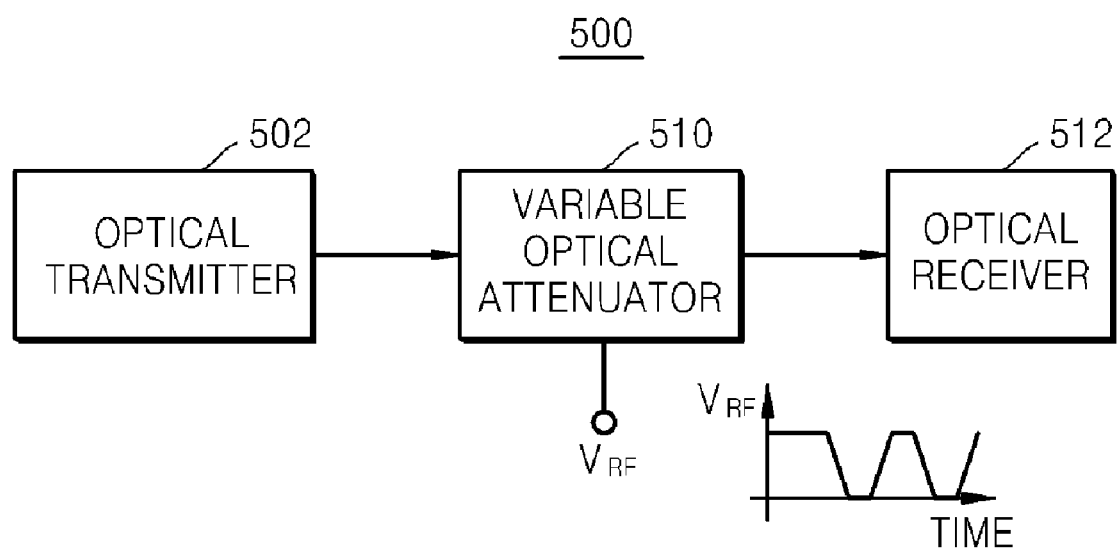
FIG. 8 is a block diagram showing the important parts of an optical device according to another embodiment of the present invention.

FIG. 8 is a block diagram showing the important parts of an optical device 500 according to another embodiment of the present invention.

The optical device 500 illustrated in FIG. 8 adopts the optical device 100 of FIG. 3 as a variable optical attenuator 510.

Referring to FIG. 8, the optical device 500 includes an optical transmitter 502, the variable optical attenuator 510, and an optical receiver 512. The variable optical attenuator 510 may be the optical device 100 having the structure illustrated in FIG. 3. The static or dynamic intensity of an optical signal generated by the optical transmitter 502 is adjusted by the variable optical attenuator 510, and then the optical signal is transmitted to the optical receiver 512.

Figure 9:
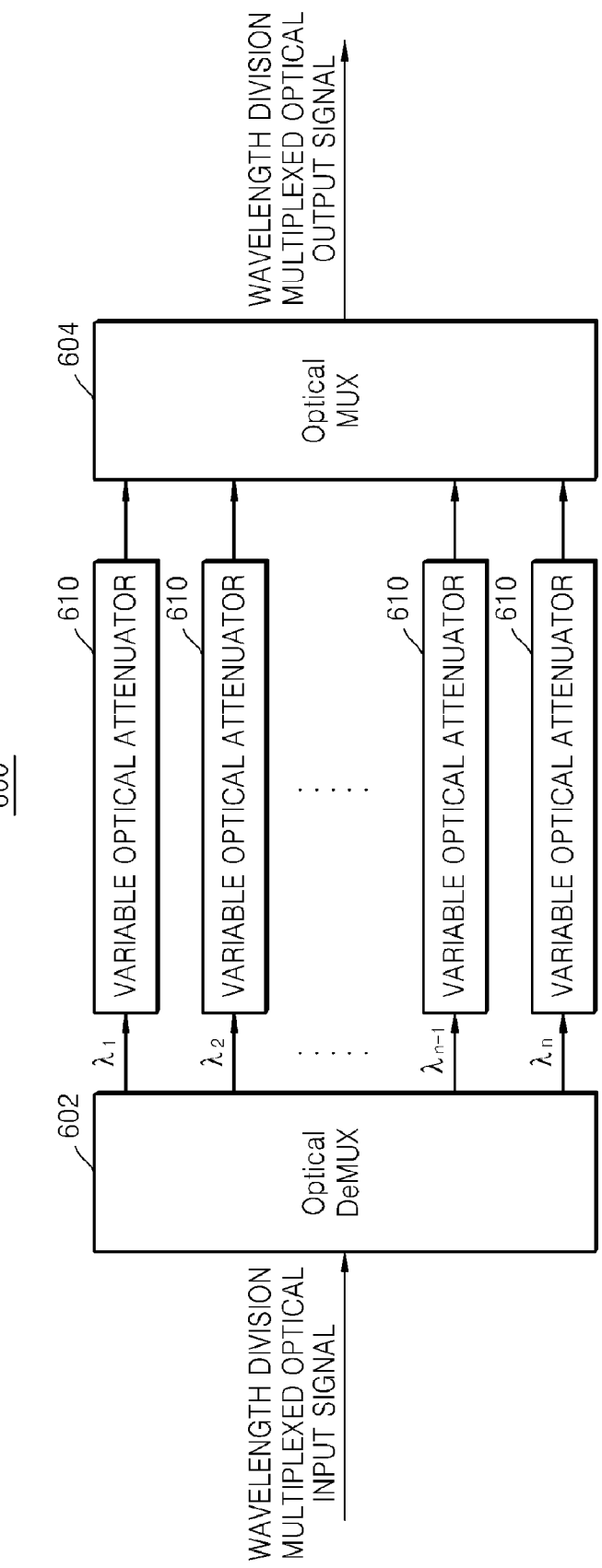
FIG. 9 is a block diagram showing the important parts of an optical device according to another embodiment of the present invention.

FIG. 9 is a block diagram showing the important parts of an optical device 600 according to another embodiment of the present invention.

The optical device 600 illustrated in FIG. 9 includes a multi-channel light intensity equalizer adopting a plurality of the optical device 100 of FIG. 3 as variable optical attenuators 610. Equivalent output light intensities of multi-channel wavelengths having different light intensities are adjusted using the plurality of variable optical attenuators 610.

Referring to FIG. 9, the optical device 600 includes a plurality of variable optical attenuators 610, an optical demultiplexer 602 connected to input and output units of the variable optical attenuators 610, and an optical multiplexer 604. Each of the variable optical attenuators 610 may be the optical device 100 having the structure illustrated in FIG. 3.

Multi-wavelengths $\lambda_1, \lambda_2, \ldots, \lambda_{n-1}, \lambda_n$ having different light intensities are classified into wavelength channels by the optical demultiplexer 602. The optical intensities may be adjusted using the variable optical attenuators 610 and then transmitted to the optical multiplexer 604 through an optical fiber or an optical passive waveguide.

Figure 10:
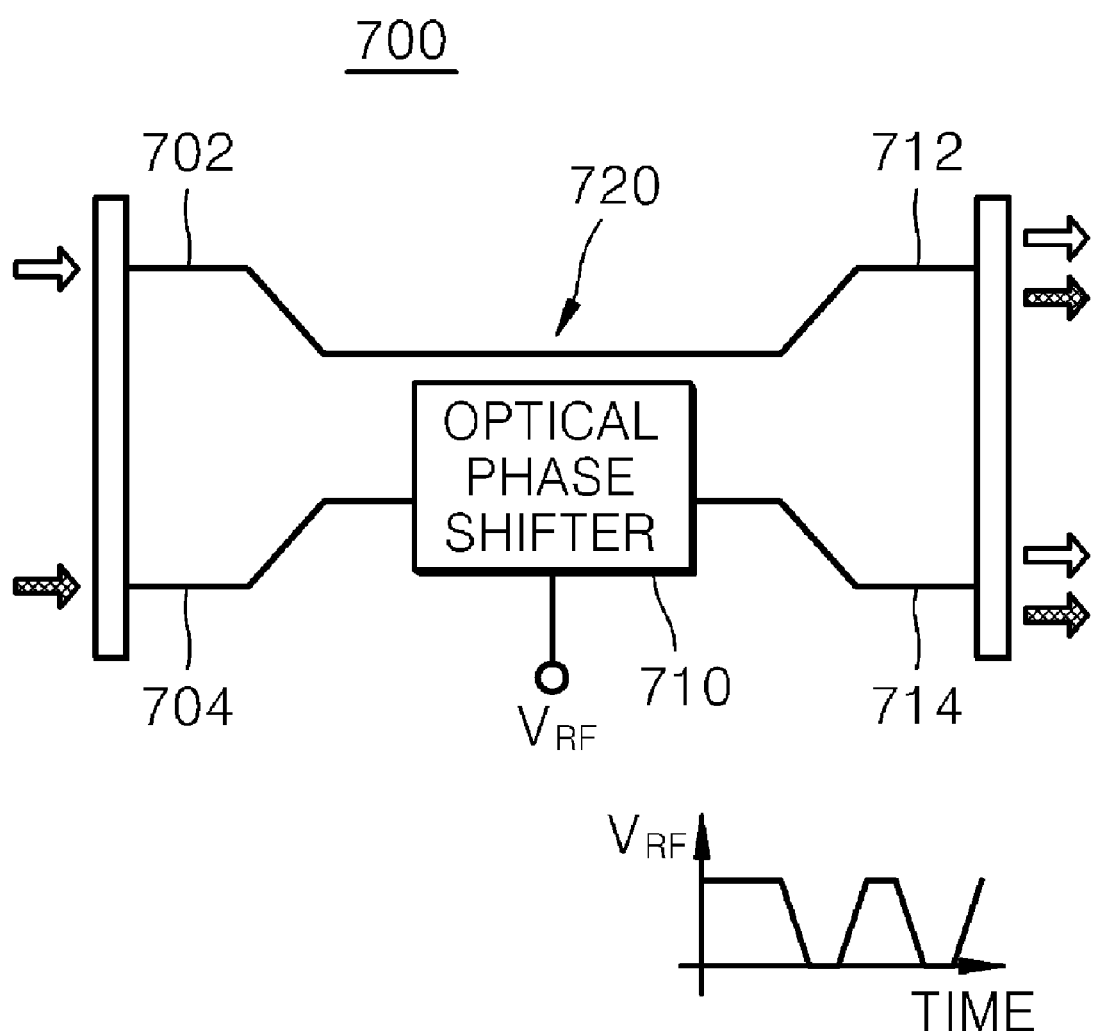
FIG. 10 shows the important parts of an optical device according to another embodiment of the present invention.

FIG. 10 shows the important parts of an optical device 700 according to another embodiment of the present invention.

The optical device 700 illustrated in FIG. 10 includes an optical switch adopting the optical device of FIG. 3 as an optical phase shifter 710.

Referring to FIG. 10, the optical switch includes a pair of input passive waveguides 702 and 704, the optical phase shifter 710 installed at least one of the pair of input passive waveguides 702 and 704, and output passive waveguides 712 and 714. The optical phase shifter 710 may be the optical device 100 having the structure illustrated in FIG. 3.

Optical signals incident on the input passive waveguides 702 and 704 pass a direction coupler 720 including the optical phase shifter 710 and are then output to the output passive waveguides 712 and 714. In the direction coupler 720, a coupling ratio of the optical signals from an upper passive waveguide to a lower passive waveguide may be adjusted depending on the variation of an effective refractive index depending on a voltage applied to the optical phase shifter 710 of the direction coupler 720 as in the ring-resonator type optical modulator illustrated in FIG. 8.

The optical device 700 illustrated in FIG. 10 may be used in a variable optical filter, an optical modulator, or the like.

Passive waveguides used in the optical devices 200, 300, 400, 500, 600, and 700 illustrated in FIGS. 5 through 10 may be formed of a Si-based, GaAs-based, InP-based, GaN-based, or ZnO-based semiconductor material, or polymer, lithium niobate, optical fiber, or the like. Also, a passive waveguide, an optical multiplexer, a variable optical attenuator, or an optical phase shifter may be integrated into a monolithic substrate using Si, InP, GaN, or GaAs.

INDUSTRIAL APPLICABILITY

The optical device according to the present invention may be applied to a high-speed optical modulator, a high-speed optical switch, a high-speed variable optical attenuator, a high-speed optical filter, a high-speed multi-channel output light equalizer, or the like.

The invention claimed is:

1. An optical device comprising:
   a semiconductor substrate of a first conductive type;
   a gate insulating layer formed on the semiconductor substrate;
   a gate of a second conductive type opposite to the first conductive type, formed on the gate insulating layer;
   a high density dopant diffusion area formed in the semiconductor substrate under the gate and doped with a first conductive type dopant having a higher density than the semiconductor substrate, the high density dopant diffusion area being spaced apart from the gate;
   a strained buried channel area formed of a semiconductor material having a different lattice parameter from a material of which the semiconductor substrate is formed, and extending between the gate insulating layer and the semiconductor substrate to contact the high density dopant diffusion area; and
   a semiconductor cap layer formed between the gate insulating layer and the strained buried channel area.

2. The optical device of claim 1, wherein the first conductive type is a p-type, and the strained buried channel area has compressive stress.

3. The optical device of claim 2, wherein the strained buried channel area is formed of a SiGe layer.

4. The optical device of claim 3, wherein the strained buried channel area has a retrograded doping profile.

5. The optical device of claim 1, wherein the first conductive type is an n-type, and the strained buried channel area has tensile stress.

6. The optical device of claim 5, wherein the strained buried channel area is formed of a SiC layer.

7. The optical device of claim 5, further comprising a SiGe buffer layer formed in the semiconductor substrate under the strained buried channel area in the semiconductor substrate, wherein the strained buried channel area is formed of a strained Si layer having tensile stress.

8. The optical device of claim 1, wherein the high density dopant diffusion area comprises first and second high density dopant diffusion areas contacting the strained buried channel area, wherein the first and second high density dopant diffusion areas are spaced apart from each other in the semiconductor substrate with the gate disposed therebetween.

9. The optical device of claim 8, wherein at least one of the first and second high density dopant diffusion areas is grounded.

10. The optical device of claim 1, wherein the high density dopant diffusion area comprises a first high density dopant diffusion area which contacts the strained buried channel area and a second high density dopant diffusion area which does not contact the strained buried channel area and is formed in the semiconductor substrate, wherein the first and second high density dopant diffusion areas are spaced apart from each other in the semiconductor substrate with the gate disposed therebetween.

11. The optical device of claim 1, further comprising a material layer formed on a backside of the semiconductor substrate opposite to a main surface of the semiconductor substrate on which the gate is formed, which covers the semiconductor substrate and has a lower refractive index than the semiconductor substrate.

12. The optical device of claim 1, wherein the semiconductor substrate is a SOI (silicon on insulator) substrate.

13. The optical device of claim 1, further comprising a current blocking insulating layer formed on the semiconductor cap layer to cover sidewalls of the gate and sidewalls of the gate insulating layer.

14. The optical device of claim 13, wherein the semiconductor cap layer comprises a protrusion extending from an upper surface of the strained buried channel area to the gate insulating layer, wherein a sidewall of the protrusion of the semiconductor cap layer is covered with the current blocking insulating layer.

15. The optical device of claim 1, wherein the semiconductor cap layer is a silicon epitaxial layer.

16. The optical device of claim 1, further comprising:
a conductive layer formed on an insulating layer and connected to the gate so as to apply a driving voltage to the gate; and
a metal line connected to the conductive layer through a via contact.

17. The optical device of claim 16, wherein the via contact is horizontally spaced apart from the gate.

18. The optical device of claim 16, wherein the conductive layer is formed of doped polysilicon.

* * * * *